United States Patent [19]

Dorinski

[11] Patent Number: 4,933,208
[45] Date of Patent: Jun. 12, 1990

[54] MULTILAYER THERMOPLASTIC SUBSTRATE AND METHOD OF MANUFACTURE

[75] Inventor: Dale W. Dorinski, Coral Springs, Fla.

[73] Assignee: Motorola, Inc.

[21] Appl. No.: 121,324

[22] Filed: Nov. 16, 1987

[51] Int. Cl.$^5$ .............................................. B05D 5/12
[52] U.S. Cl. ........................................ 427/96; 427/97; 430/317; 430/319
[58] Field of Search ............... 430/311, 313, 314, 315, 430/317, 319; 427/97, 96

[56] References Cited

U.S. PATENT DOCUMENTS

| | | | |
|---|---|---|---|
| 3,600,330 | 8/1971 | Schneble et al. | 430/313 X |
| 4,424,095 | 1/1984 | Frisch et al. | 156/629 |
| 4,670,325 | 6/1987 | Bakes et al. | 428/209 |

Primary Examiner—Jose Dees
Attorney, Agent, or Firm—Daniel K. Nichols

[57] ABSTRACT

A manufacturing process for a mutlilayer thermoplastic printed circuit substrate (200) begins with a thermoplastic core substrate (202) having a printed circuit pattern (204) on a surface (202A) of the core substrate. Either fully reacted or partially reacted thermoplastic material is dissolved in a suitable dissolving agent and then applied in the liquid state over the surface (202A) of the core substrate. Application is by spraying, dipping, spinning or rolling. This results in a layer of liquid thermoplastic material covering the printed circuit pattern on the core substrate. The dissolving agent is then removed from the thermoplastic layer, leaving behind a uniform, dry hard, dielectric film of thermoplastic resin (206). Using photolithographic techniques, a via (206A) is opened up in the dielectric layer. If the starting material for the dielectric layer was partially reacted thermoplastic resin, the dielectric layer is now fully cured. A second printed circuit pattern (208) is then applied over the dielectric layer and into the via, thereby forming a conductive through-hole, which connects the two printed circuit patterns.

1 Claim, 1 Drawing Sheet

MULTILAYER THERMOPLASTIC SUBSTRATE AND METHOD OF MANUFACTURE

BACKGROUND OF THE INVENTION

This invention pertains to printed circuits, and more particularly to a process for manufacturing a multilayer printed circuit substrate using high temperature thermoplastic materials.

There are a number of thermoplastic materials that can be molded or otherwise formed into shapes of printed circuit substrates. To be a suitable material for a printed circuit substrate, however, the material should be able to withstand the temperatures that result from soldering. When ordinary tin/lead solders are used, the substrate must be able to withstand temperatures in the region of 200°-230° C. If low temperature solders are used, however, the substrate needs to withstand slightly lower temperatures in the region of 170°-200° C. Accordingly, the term "high temperature thermoplastic" will be used in the specification to indicate thermoplastic materials that have a heat deflection temperature of 170° C. or greater, as determined by the American Society of Testing and Materials (ASTM) standard test No. D648. Such materials include poletherimide (PEI), polysulfone, polyethersulfone, polyarylsulfone, polyarylate, polybutyleneterephthalate, polyetheretherketone and blended combinations thereof.

Generally speaking, there are three processes for applying printed circuit patterns to thermoplastic substrates; specifically, foil bonding, electroless plating and the vacuum deposition process which is described in a co-pending application entitled "High Temperature Thermoplastic Substrate Having A Vacuum Deposited Solderable Electrical Circuit Pattern And Method Of Manufacture". These processes can be used to manufacture single and double sided thermoplastic printed circuit substrates, but additional process steps are necessary to manufacture a multilayer substrate.

A prior art multilayer thermoplastic printed circuit substrate is illustrated in FIG. 1. Referring to this figure, to manufacture the multilayer substrate 100, two double sided thermoplastic printed circuit substrate layers 102 and 104 are adhesively bonded together by an intermediate layer of epoxy 106. Each of the double sided substrate layers 102 and 104 has upper and lower printed circuit patterns 102A and B, and 104A and B respectively, which are electroless plated onto the individual substrate layers. Printed circuit pattern 102A is plated completely through a hole 102C in the upper substrate and onto the lower surface of a protuberance 102D that surrounds the hole. Similarly, printed circuit pattern 104B is plated completely through a hole 104C in the lower substrate and onto the inner surface of an indentation 104B. When the substrate layers 102 and 104 are joined, protuberence 102D mates with indentation 104D, thereby forming a conductive through-hole 102C/104C which electrically joins printed circuit patterns 102A and 104B.

Described below is a different and improved method of manufacturing a multilayer thermoplastic printed circuit substrate.

SUMMARY of the INVENTION

Briefly, the invention is a process for manufacturing a multilayer thermoplastic printed circuit substrate. To begin, a core substrate is provided having a first printed circuit pattern on a first surface of the core substrate. A layer of a liquid solution of thermoplastic material that includes a suitable dissolving agent is applied over the first surface of the core substrate. The dissolving agent is then removed, solidifying the applied layer, and a second printed circuit pattern is applied over the layer of thermoplastic material.

DESCRIPTION OF THE PREFERRED EMBODIMENT

Figure 1:
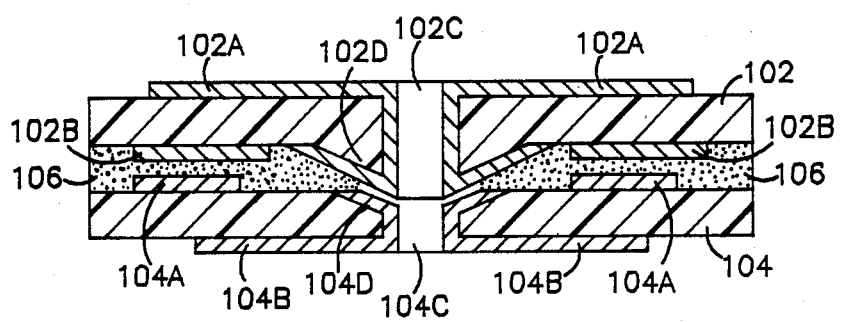
FIG. 1 is a cross-sectional view of a prior art multilayer thermoplastic printed circuit substrate.
Figure 2:
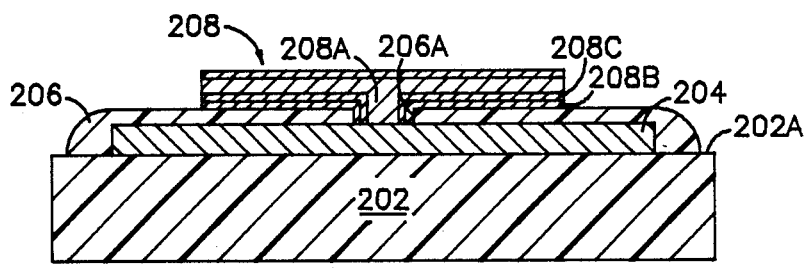
FIG. 2 is a cross-sectional view of the multilayer thermoplastic printed circuit substrate of the present invention as it appears at the completion of the manufacturing process.

FIG. 2 is a cross sectional view of a multilayer thermoplastic printed circuit substrate 200 manufactured by the present process. Referring to this figure, the manufacturing process begins with a thermoplastic core substrate 202 that includes an electrical printed circuit pattern 204 on a surface 202A of the core substrate. Next, thermoplastic resin is dissolved in a suitable dissolving agent and the resulting liquid is applied over surface 202A of the core substrate to form thermoplastic layer 206, which also covers printed circuit pattern 204. Application of layer 204 is preferrably by spraying, although rolling, dipping or spinning may also be suitable, depending on the desired thickness and uniformity of layer 206.

There are two variations to the multilayer manufacturing process. In the first process variation, the liquid thermoplastic solution used to form layer 206 is a fully reacted thermoplastic resin dissolved in an appropriate dissolving agent. If the theraoplastic resin is polyetherimide, polysulfone, polyethersulfone, polyarylsulfone, polyarylate, polybutyleneterephthalate, or blends thereof, the dissolving agent is preferrably methylene chloride or, alternatively, N-methyl pyrillidone, dimethylformamide or trichloroethylene. If the thermoplastic resin is polyetheretherketone, the dissolving agent is preferrably sulfuric acid or, alternatively, a polar aromatic solvent such as phenols or cresols.

In the second process variation, the liquid thermoplastic solution used to form layer 206 is partially reacted (i.e., partially cured) polyetherimide resin dissolved in an appropriate dissolving agent, preferrably a dipolar aprotic solvent or, alternatively, a monoalkylether of ethylene glycol or diethylene glycol, such as Methyl Cellosolve ®. These dissolving agents may also be diluted in water, for example, one part water to one part solvent. The second process variation also requires an additional curing step which will be described later.

With either process variation, the next step is to remove the dissolving agent by drying the substrate in an oven until the applied thermoplastic liquid layer 206 becomes a uniform, dry, hard, dielectric film of thermoplastic resin. Actual drying times and temperatures are well known in the art and will depend upon the particular thermoplastic material and dissolving agent used, and the thickness of dielectric layer 206. When using the second process variation, drying times and temperatures should be kept at a minimum temperatures should be below 125° C.) to insure that dielectric layer 206 does not become fully cured at this time.

Figure 3:
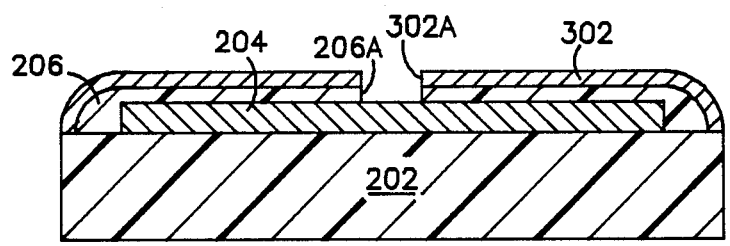
FIG. 3 is a cross-sectional view of the multilayer thermoplastic printed circuit substrate of the present invention as it appears at an intermediate stage of the manufacturing process.

To interconnect two or more printed circuit patterns, e.g., 204 and 208, conductive through-holes should be provided. To form conductive through-holes, vias (i.e., holes in the dielectric material into which conductive material can be deposited) are opened up in dielectric layer 206, as illustrated in FIG. 3. Referring to this figure, a layer of photoresist 302 is applied over dielectric layer 206, pattern exposed, and developed (as is well known in the printed circuit board art). This opens up a window 302A in the layer of photoresist. Next, a suitable dissolving agent, preferably the same agent that was used to dissolve the thermoplastic resin for dielectric layer 206, is applied over photoresist layer 302 and into window 302A. This opens up a via 206A by dissolving the dielectric layer 206 immediately underneath window 302A, and, as a result, exposes a portion of printed circuit pattern 204. Photoresist layer 302 is then removed using a conventional photoresist stripper.

If the second process variation is being used, dielectric layer 206 consists of a partially cured thermoplastic film at this stage of the manufacturing process. Before proceeding to the next step, dielectric layer 206 should be fully cured by baking the substrate in an oven. The appropriate baking times and temperatures will depend on the particular materials used and are well known in the art.

A second electrical printed circuit pattern is then applied over dielectric layer 206 such that conductive material fills via 206A, thereby forming a conductive through-hole 208A. Conductive through-temperatures hole 208A provides an electrical connection between printed circuit patterns 204 and 208. All printed circuit patterns, e.g., 204 and 208, are prefe rably applied by vacuum depositing a solderable conductor as described in a co-pending application entitled "High Temperature Thermoplastic Substrate Having A Vacuum Deposited Solderable Electrical Circuit Pattern And Method Of Manufacture" that was filed on the same day as the present application and which is wholly incorporated by reference herein. Briefly, the surface of dielectric layer 206 is first prepared by creating a reactive surface suitable for bonding a solderable printed circuit pattern to the thermoplastic material. Next, a solderable conductor is vacuum deposited over the reactive surface. This solderable conductor includes a vacuum deposited base layer 208B, and a solderable layer 208C vacuum deposited over the base layer. This solderable conductor can then be formed into a printed circuit pattern by conventional photolithographic techniques. Other methods of applying printed circuit patterns, such as foil bonding and electroless plating, are also suitable. If conductive through-holes are required, however, the printed circuit patterns can be applied by foil bonding, but additional process steps, such as electroplating, are required to form the conductive through-holes.

Additional layers of thermoplastic dielectric material and printed circuit patterns, similar to layer 206/208, can be applied on top of layer 206/208. It is preferred, however, to start with a double sided core substrate and to add additional layers on both upper and lower surfaces of the core substrate.

It is preferred that the same type of thermoplastic material be used to manufacture both the core substrate and the dielectric layers. This provides the strongest bond between the various layers and eliminates any problems that might be caused by differences in the thermal coefficients of expansion of two dissimilar materials. In addition, the high temperature thermoplastic materials described above have very low loss electrical properties, and a homogeneous multilayer substrate preserves these low loss properties. It is preferred that a high temperature thermoplastic material be used such that the resulting substrate will not be damaged when exposed to soldering temperatures. Of the high temperature thermoplastic meterials listed above, PEI is the preferred material. If the resulting substrate will never be exposed to soldering temperatures, other low temperature thermoplastic materials may also be suitable.

I claim as my invention:

1. A process for manufacturing a multilayer thermoplastic printed circuit substrate, comprising the steps of:
    providing a thermoplastic core substrate having a first electrical printed circuit pattern on a first surface of said core substrate; and
    providing a liquid solution of thermoplastic material including a suitable dissolving agent;
    applying a layer of said liquid solution of thermoplastic material over said first surface of said core substrate;
    removing said dissolving agent from said layer of thermoplastic material; and
    applying a second electrical printed circuit pattern over said layer of thermoplastic material;
    said solution of thermoplastic material including fully reacted thermoplastic resin;
    said thermoplastic resin including polyetheretherketone, and said dissolving agent including sulfuric acid or a polar aromatic solvent.

* * * * *